United States Patent [19]

Sim

[11] Patent Number: 5,663,909

[45] Date of Patent: Sep. 2, 1997

[54] METHOD OF ERASING A FLASH MEMORY DEVICE

[75] Inventor: Hyun Soo Sim, Sungnam-Shi, Rep. of Korea

[73] Assignee: Hyundai Electronic Industries Co., Ltc., Kyungki-Do, Rep. of Korea

[21] Appl. No.: 673,056

[22] Filed: Jul. 1, 1996

[30] Foreign Application Priority Data

Jun. 30, 1995 [KR] Rep. of Korea ............... 95-18560

[51] Int. Cl.$^6$ ................................................. G11C 29/00
[52] U.S. Cl. ........................... 365/185.33; 365/185.22; 365/185.12
[58] Field of Search ................... 365/185.33, 185.22, 365/238.5, 185.12

[56] References Cited

U.S. PATENT DOCUMENTS 5,339,279  8/1994  Toms et al. ................ 365/185.12
5,396,468  3/1995  Harari et al. ............... 365/218

*Primary Examiner*—David C. Nelms
*Assistant Examiner*—Michael T. Tran
*Attorney, Agent, or Firm*—Fish & Richardson, P.C.

[57] ABSTRACT

A method of erasing a flash memory device which can reduce the erasure time by performing an erasure and an erasure verification on a plane by plane basis, when performing a chip erase having a plurality of planes is disclosed.

5 Claims, 2 Drawing Sheets

METHOD OF ERASING A FLASH MEMORY DEVICE

FIELD OF THE INVENTION

The present invention relates to a method of erasing a flash memory device, and more specially to a method of erasing a flash memory device which can perform an erasure mode and an erasure verification mode simultaneously on a plane by plane basis when erasing a chip having a plurality of planes.

BACKGROUND OF THE INVENTION

Generally, when erasing a chip of a large scale integrated flash memory device, the chip divided into a plurality of planes can not be erased at the same time. The reason is that an erasure current and a specification etc. could not be satisfied and therefore an erasure and erasure verification operation are sequentially performed on a plane by plane basis. A conventional method of erasing a flash memory device will be explained hereinafter by reference to FIG. 1.

FIG. 1 is a flow chart for illustrating a conventional method of erasing a flash memory device. The flash memory device comprises four (4) planes.

The flow charge begins from a start signal and then goes to a step 11. Initial value of an internal counter within the chip is set to N=1 where N is the erasure number in accordance with an erase command for the chip in the step 11. After an erasure operation for a first plane P1 is performed at a step 12. In a step 14, it is verified whether the first plane P1 are normally erased. In the above step 14, if the first plane are not normally erased, it goes to a step 15. In the above step 15, it is verified whether N is identical to the final erasure number N1 previously set in the internal counter of the chip. In the above step 15, if N is identical to the final erasure number N1 it goes to a step 26. Then it determines that the plane P1 is a failure and completes the erasure operation. However, in the above step 15, if N is not identical to the final erasure number N1 it goes to a step 13. In the above step 13, it causes the erasure number N to increase and return to the step 12 and then continues to perform the erasure operation.

However, in the above step 14, if the first plane P1 becomes normally an erasure state, it goes to a step 16. Then it performs an erasure operation for the second plane P2 and then goes to a step 17. In the above step 17, it is verified that the second plane P2 is normally erased. In the above step 17, if the second plane P2 is not normally erased, it goes to a step 18. In the above step 18, it is verified whether it is identical to the erasure number N1 previously set in the internal counter of the chip. In the above step 18, if it is identical to the erasure number N1 previously set in the internal counter of the chip, it goes to a step 26. Then it determines that the chip is a failure and then completes the erasure operation. However, in the above step 18, if it is not identical to the erase number N1 previously set in the internal counter of the chip, it goes to a step 27. In the above step 17, it causes the erasure number to increase and return to the step 16 and then continues to perform the erasure operation.

However, in the above step 17, if the second plane P2 becomes normally an erasure state, it goes to a step 19. Then it performs an erasure operation for the third plane P3 and then goes to a step 20. In the above step 20, it is verified that the third plane P3 is normally erased. In the above step 20, if the third plane P3 is not normally erased, it goes to a step 21. In the above step 21, it is verified whether it is identical to the erasure number N1 previously set in the internal counter of the chip. In the above step 21, if it is identical to the erase number N1 previously set in the internal counter N of the chip, it goes to a step 26. Then it determines that the chip is a failure and then completes the erasure operation. However, in the above step 21, if it is not identical to the erase number N1 previously set in the internal counter of the chip, it goes to a step 28. In the above step 28, it causes the erasure number to increase and return to the step 19 and then continues to perform the erase operation.

However, in the above step 20, if the third plane P3 is normally erased, it goes to a step 22. Then an erasure for the fourth plane P4 is performed and then goes to a step 23. In the above step 23, it is verified that the fourth plane P4 is normally erased. In the above step 23, if the fourth plane P4 is not normally erased, it goes to a step 24. In the above step 24, it is verified whether it is identical to the erase number N1 previously set in the internal counter of the chip. In the above step 24, if it is identical to the erasure number N1 previously set in the internal counter of the chip, it goes to a step 26. Then it determines that the chip is a failure and then completes the erasure operation. However, in the above step 24, if it is not identical to the erasure number N1 previously set in the internal counter of the chip, it goes to a step 29. In the above step 29, it causes the erasure number to increase and return to the step 22 and then continues to perform the erasure operation.

However, in the above step 23, if the fourth plane P4 becomes normally an erasure state, it goes to a step 25. Then it determines that all the planes P1 through P4 are normal and completes the erasure operation.

As mentioned above, the conventional method of erasing the chip has a problems of a long erasure time because it sequentially performs an erasure operation and an erasure verification for one plane.

SUMMARY OF THE INVENTION

Accordingly, it is an object of the present invention to provide a method of erasing a flash memory device which can overcome the above-mentioned problems, by performing an erasure and an erasure verification at the same time on a plane by plane basis when erasing a chip having into a plurality of planes.

To accomplish the above object, a method of erasing a flash memory device, comprises the steps of: erasing a first plane; performing an erasure verification for the first plane and an erasure operation for a second plane at the same time; performing an erasure verification for the second plane and an erasure operation for a third plane at the same time; and performing an erasure verification for the third plane and an erasure operation for a fourth plane at the same time.

BRIEF DESCRIPTION OF THE DRAWINGS

For fuller understanding of the nature and objects of the invention, reference should be had to the following detailed description taken in conjunction with the accompanying drawings in which.

DESCRIPTION OF THE INVENTION

Below, the present invention will be described in detail by reference to the accompanying drawings.

Figure 1:
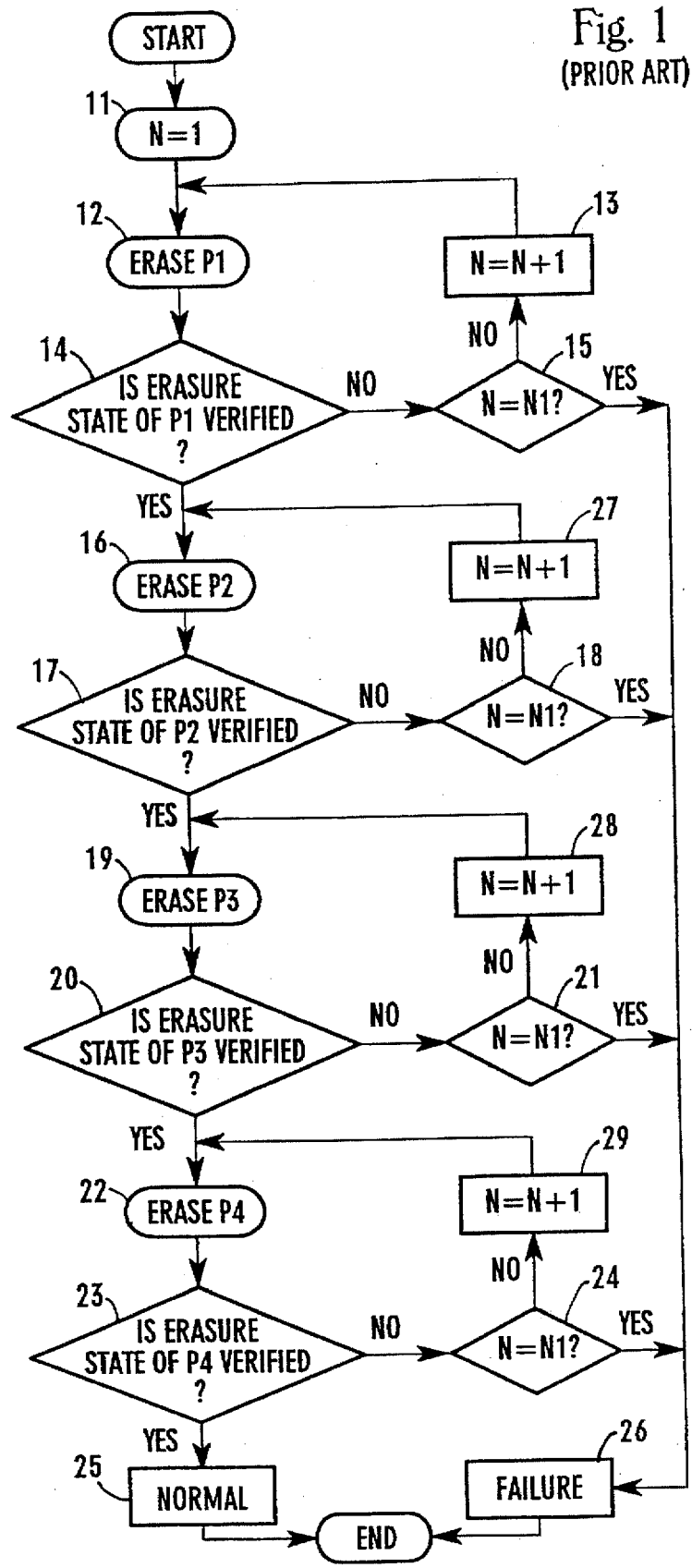
FIG. 1 is a flow chart for illustrating a conventional method of erasing a flash memory device.
Figure 2:
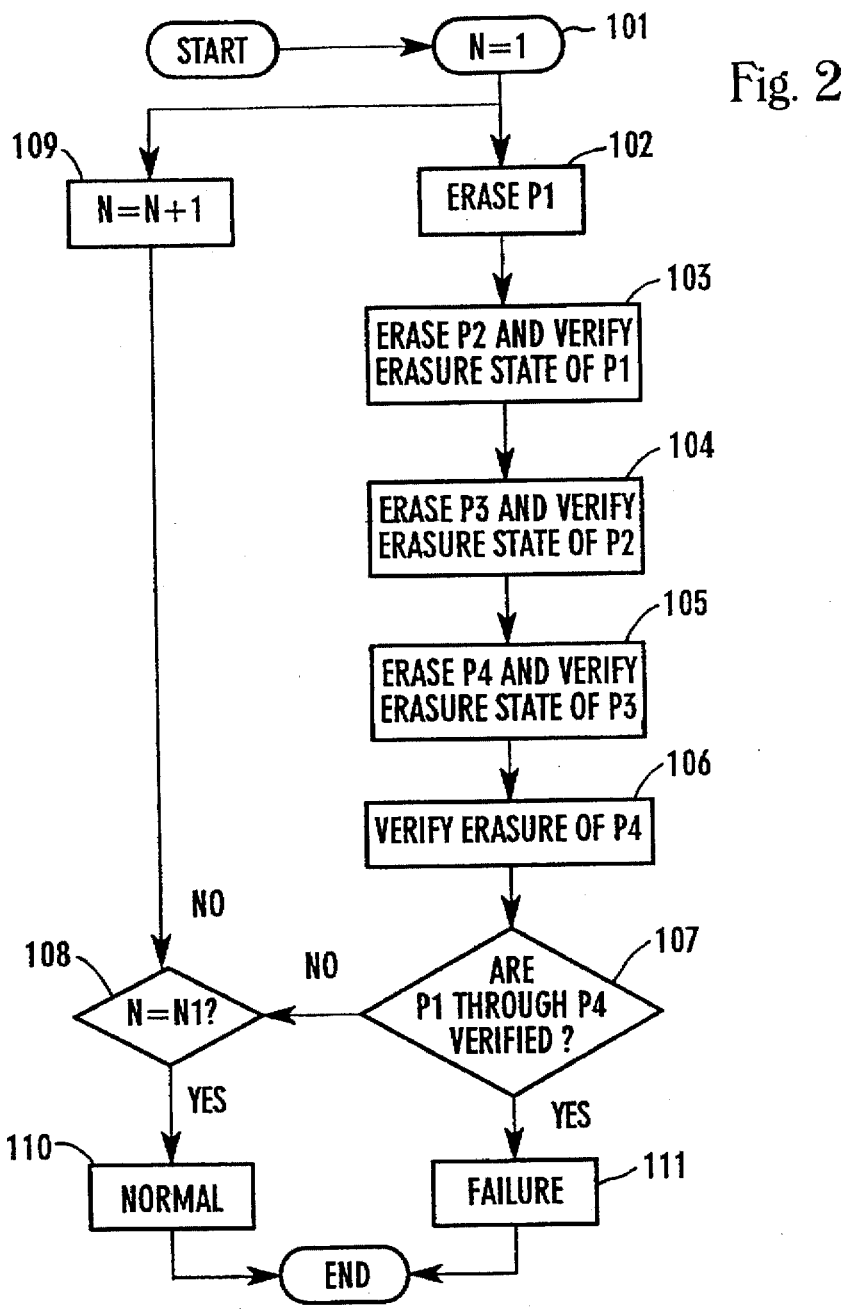
FIG. 2 is a flow chart for illustrating a method of erasing a flash memory device according to the present invention.

FIG. 2 is flow chart for illustrating a method of erasing a flash memory device according to the present invention and the operation will be explained hereinafter.

A flow chart begins from a start signal and then goes to a step 101. In a step 102, initial value of an internal counter within a chip to N−1, where N is the erasure number. An erasure for a first plane P1 is performed in the step 102. In the above step 102, an erasure verification operation is not performed. In a step 103, an erasure operation for a second plane P2 is performed and it is verified whether the first plane P1 was normally erased and then goes to a step 104. In the above step 104, an erasure operation for a third plane P3 is performed and it is verified whether the second plane P2 was normally erased and then goes to a step 105. In the above step 105, an erasure operation for a fourth plane P4 is performed and it is verified whether the third plane P3 was normally erased and then goes to a step 106. In the above step 106, it is verified whether the fourth plane P4 was normally erased and then goes to a step 107. In the above step 106, an erasure operation is not performed. In the above step 107, erasure results of the planes P1 through P4 in which an erase verification operation is already performed are verified. In the above step 107, if the plurality of planes P1 through P4 are not normally erased, it goes to a step 108. In the above step 108, it is verified whether it is identical to the erase number N1 previously set in the internal counter of the chip. In the above step 108, if it is identical to the erasure number N1 previously set in the internal counter of the chip, it goes to a step 110. Then it is determined that the chip is a failure and completes the erasure operation. However, in the above step 108, if it is not identical to the erasure number N1 previously set in the internal counter of the chip, it goes to a step 109. In the above step 100, it causes the erasure number to increase and return to the step 102 and then continues to perform the erasure operation.

However, in the above step 107, if the plurality of planes P1 through P4 are normally in erasure state, it goes to step 111 and then determines that all the planes P1 through P4 are normal and it completes the erasure operation.

Figure 3:
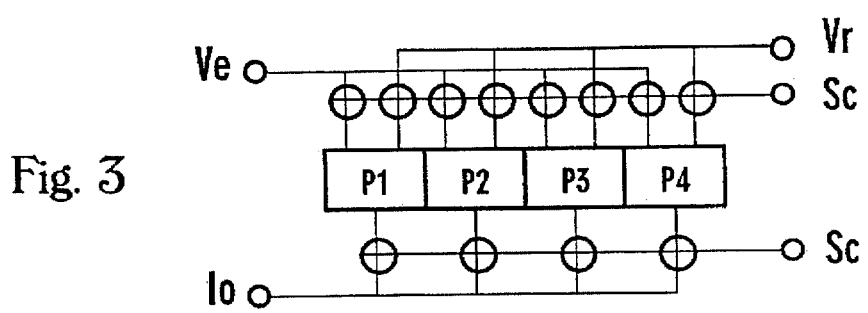
FIG. 3 is a circuit for showing a condition for applying a bias voltage to each plane to perform an erasure operation according to the present invention.

FIG. 3 is a circuit for showing a condition for applying a bias voltage to each plane to perform an erasure operation according to the present invention. The peripheral voltages Vc, Vr are those which are supplied to each plane P1 through P4, and the control signal Sc controls input/output signals of each plane and functions to set the mode of each of the planes by controlling the multiplex of each plane. The erasure operation and the erasure verification are performed during a longer performing time between an erasure performing time and an erasure verification time.

As mentioned above, the present invention can reduce the erasure time and therefore has an outstanding effect of cost reduction, by performing an erasure operation and an erasure verification at the same time.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of erasing a chip having into a plurality of planes of a flash memory device, comprising the steps of:

erasing a first plane;

performing an erasure verification for said first plane and an erasure operation for a second plane at the same time;

performing an erasure verification for said second plane and an erasure operation for a third plane at the same time; and performing an erasure verification for said third plane and an erasure operation for a fourth plane at the same time.

2. A method of erasing a flash memory device claimed in claim 1, wherein said erase verification is performed at the plane of which an erasure operation is already performed.

3. A method of erasing a flash memory device claimed in claim 1, wherein said erasure operation and erasure verification operation is performed during a longer performing time between an erasure perform time and an erasure verification time.

4. A method of erasing a flash memory device claimed in claim 1 wherein, during erasing said first plane, an erase operation is not performed at the residual planes.

5. A method of erasing a flash memory device claimed in claim 1, wherein, during performing an erasure verification of said fourth plane an erasure operation is not performed at the residual planes.

* * * * *